United States Patent [19]

Bankes et al.

[11] 4,324,600
[45] Apr. 13, 1982

[54] INTRODUCING ELONGATED MAGNETIC ARTICLES INTO VACANT POSITIONS ON A CARRIER

[75] Inventors: Kristen E. Bankes, Reading; Donald M. Large, Temple; Fred J. Reinhard, Whitfield Reading; Joseph A. Tamashasky, New Philadelphia, all of Pa.

[73] Assignee: Western Electric Co., Inc., New York, N.Y.

[21] Appl. No.: 172,730

[22] Filed: Jul. 28, 1980

[51] Int. Cl.$^3$ .............................................. B31C 1/00
[52] U.S. Cl. ...................... 156/64; 156/378; 156/552; 198/619; 198/690; 209/573; 221/212
[58] Field of Search ............... 156/64, 378, 552; 221/266, 212; 198/619, 690; 209/573

[56] References Cited

U.S. PATENT DOCUMENTS

| | | | |
|---|---|---|---|
| 3,388,795 | 6/1968 | Beroset et al. | 209/573 X |
| 3,537,580 | 11/1970 | Beroset et al. | 198/690 X |
| 3,951,305 | 4/1976 | Rondas | 221/212 |
| 4,021,292 | 5/1977 | Bates et al. | 156/552 |
| 4,282,908 | 8/1981 | Bankes et al. | 198/690 X |

OTHER PUBLICATIONS

"Moving Articles through Descending Magnetic Fields", K. E. Bankes et al., Published Tech. Digest-Western Electric No. 57, p. 1, Jan. 1980.

*Primary Examiner*—David A. Simmons
*Attorney, Agent, or Firm*—D. C. Watson; G. W. Houseweart

[57] ABSTRACT

Elongated magnetic articles 12 are introduced into vacant positions 31 on a carrier wheel 18 for a given operation. A magnetic bin 40 has a feed end in communication with wheel 18 and includes spaced sidewalls 41–44, with arm sections 43–44 thereof extending substantially beyond the periphery of wheel 18 and along the sides thereof. There is established between said sidewalls 41–44 a first, magnetic field and a second, stronger field to orient and suspend the articles 12 in bin 40. However, the field between arm sections 43–44 is established substantially within the periphery of wheel 18 and such field includes the stronger second field located in a specific region of arm sections 43–44.

For loading articles 12 into continuously occurring vacant positions 31 which are advanced in an ascendent path, the stronger second field is located in a lower region of arm sections 43–44.

For a difficult make-up function, articles 12 are introduced into randomly occurring vacant positions 31 as such are advanced in a descendent path. A bin 80 also has a strong second magnetic field located within the periphery of wheel 18; however, such field is confined to an upper region of arm sections 83–84 and there is a non-magnetic lower region to avoid downwardly attracting articles 12.

In a taping operation, means are employed to machine sense all diodes, to machine eject unacceptable diodes 13 and to machine count all diodes and positions 31. Input is made to a microprocessor which determines the exact time to control various functions on a substantially automatic basis.

13 Claims, 13 Drawing Figures

INTRODUCING ELONGATED MAGNETIC ARTICLES INTO VACANT POSITIONS ON A CARRIER

TECHNICAL FIELD

This invention relates to introducing elongated magnetic articles into vacant positions on a carrier. The invention further relates to improving the efficiency of filling vacant positions on a carrier, especially when the carrier is advanced at high rates of speed. Also, vacant positions can occur, on a random basis, between testing and taping of axially leaded diodes on a carrier wheel and this invention further relates to filling those randomly vacant positions.

BACKGROUND OF THE INVENTION

In the production of elongated magnetic articles, such as axially leaded diodes, it has become customary to perform several manufacturing operations with the diodes positioned on a carrier wheel. The problem is to introduce the diodes into vacant positions on the wheel with high efficiency so that all positions are filled, particularly at the high rates of production expected today.

Heretofore, magnetic bins have been used to orient and suspend a supply of such diodes in a mutually parallel relationship in communication with the periphery of a carrier wheel. Such a bin has often been inclined toward the wheel so the diodes were urged into positions thereon. For moderate rates of position advancement, and where high efficiency in filling the positions has not been critical, the conventional magnetic bins have been satisfactory. Now, however, production rates of 50,000 to 70,000 diodes per hour are expected and filling efficiency is expected to be close to 100%. Therefore, new and improved apparatus and methods are indicated to meet the new expectations, particularly in diode packaging operations.

A copending application, Ser. No. 153,103, assigned to the assignee of this application, is believed pertinent to the instant invention and is hereby incorporated herein by reference. The incorporated application describes an operation for adhering diodes to tape for shipping purposes as follows: "Typically, such taping takes place by carrying the diodes in a closely spaced, parallel relationship on the periphery of a carrier wheel and by manipulating the tape such that it contacts a rather large portion of the periphery so that good adherence of the diodes to the tape is achieved. Typically, the wheel is loaded at a top portion and the taping takes place along a lower portion of the wheel.

It is advantageous to test the diodes on the same wheel which is used for taping to make certain each diode is electrically acceptable just before it is adhered to the tape. However, with the tape contacting the lower portion of the wheel, it becomes appropriate to do the testing and subsequent operations along the upper periphery of the wheel. Therefore, as the wheel rotates toward the tape, each diode is electrically tested and an unacceptable diode, for example, one having the wrong polarity is removed and replaced."

The incorporated application discloses an invention for automatically removing an unacceptable diode from the top portion of a carrier wheel. Consequently, such removal creates randomly located, vacant positions on the wheel which are desirably filled before taping takes place along the lower portion of the wheel. Heretofore, it is believed that such filling has typically been done on a manual basis, often with the wheel being stopped for this purpose. Now, a desire to enhance the speed of diode manufacture has inspired efforts to automatically introduce diodes into the vacant positions without stopping the wheel.

Vacant positions on a carrier wheel are typically filled as the periphery of the wheel is advanced in an ascendent path so that diodes which are not in position tend to return to the bin or to wheel positions under the force of gravity. The problem in filling vacant positions which occur between testing and taping is that such filling is to be done as the periphery of the wheel advances in a descendant path and gravity works against such filling. Furthermore, the diodes are to be introduced into such randomly occurring positions without dislodging closely spaced, adjacent diodes which have been successfully tested and are ready for taping.

SUMMARY OF THE INVENTION

In view of the foregoing, it is an object of this invention to provide new and improved apparatus and methods for introducing elongated magnetic articles into vacant positions on a carrier. Another object is to introduce such elongated magnetic articles into vacant positions which occur on a random basis between filled positions on a carrier. A further object is to machine control various functions required to properly introduce articles into vacant positions on a carrier for a given operation such as, for example, a diode taping operation.

With these and other objects in mind, the present invention includes a bin containing such articles, having a feed end in communication with the carrier and having spaced sidewalls with arm sections thereof extending substantially beyond the periphery of the carrier and along the sides thereof. The carrier is advanced along a path in communication with the articles in the bin. There is established between and transverse to the bin sidewalls, a first magnetic field of sufficient strength relative to the weight and material of the articles to orient and suspend such articles between the sidewalls. There is also established between and transverse to the sidewall arm section of the bin, a second magnetic field of sufficient strength relative to the weight and material of the articles and the conditions on the carrier to introduce the articles into vacant positions on the carrier.

In an ancillary embodiment, means are provided for stopping the articles from feeding from a bin. Also, in another ancillary embodiment, means are provided for stopping the articles from feeding from a bin and for replenishing the bin with articles.

In a further embodiment, the second magnetic field is stronger than the first magnetic field and such second field is located within the periphery of the carrier in a region such that the articles are introduced into vacant positions at a desired location along the periphery of the carrier. In a more specific embodiment, the second magnetic field is located in a bottom region between the sidewall arm sections such that the articles are introduced along the periphery of the carrier at a bottom portion of the bin.

In another embodiment wherein the bin includes a storage section having full depth magnets and a feed section having substantially less than full depth sidewall arm magnets, said feed section is in communication with the carrier and there is a non-magnetic region at the feed end of the bin under the arm magnets. In a further embodiment, the carrier is advanced in a descendent path between and along the sidewall arm magnets and through the non-magnetic region of the bin.

In a method of introducing articles into vacant positions on a carrier for a given operation, such as diode taping, various functions are machine controlled. The articles are machine loaded into continuously occurring vacant positions on an advancing carrier. Each position and each article is machine sensed at a testing location to determine the number of vacant positions, if any, and the number of unacceptable articles, if any, passing the testing location. The unacceptable articles are machine ejected from the carrier and the number of vacant positions is machine added to the number of unacceptable articles to determine a number of articles which are machine made-up on the carrier.

In a further embodiment, the number of acceptable articles passing the testing location is also determined and machine added to the number of articles to be made-up. The resultant sum is used to determine, from beyond the testing location, a cumulative number of articles supplied to a given operation at any instant. By machine comparing the number of articles supplied with a desired number of such articles, a last position is identified which will advance a last required article to the operation. When such last position is advanced beyond a make-up bin, a camming mechanism is machine actuated to stop feeding articles from the bin and to divert articles from the carrier into the bin to replenish the bin.

In a further embodiment, replenishing the make-up bin is also machine controlled. There is machine determined a number of potentially acceptable articles on the carrier which are presumed to occur between the loading bin and the identified last position for advancing the last article to be supplied. Such number is machine compared with a machine determined number of articles for replenishing the make-up bin and the loading of the carrier is machine stopped when equivalence is reached. Also, in a specific embodiment wherein articles are to be taped, a development of trailer tape is machine controlled. A number of positions are determined which pass the testing location after the identified last position for advancing the last article for taping. Such number is machine compared with a predetermined number of such positions needed to develop the trailer tape and the carrier is machine stopped when equivalence is reached.

BRIEF DESCRIPTION OF THE DRAWING

The above described and other objects, advantages, and features of the invention will be more readily understood from the following detailed description when read in conjunction with the accompanying drawing, wherein.

Figure 1:
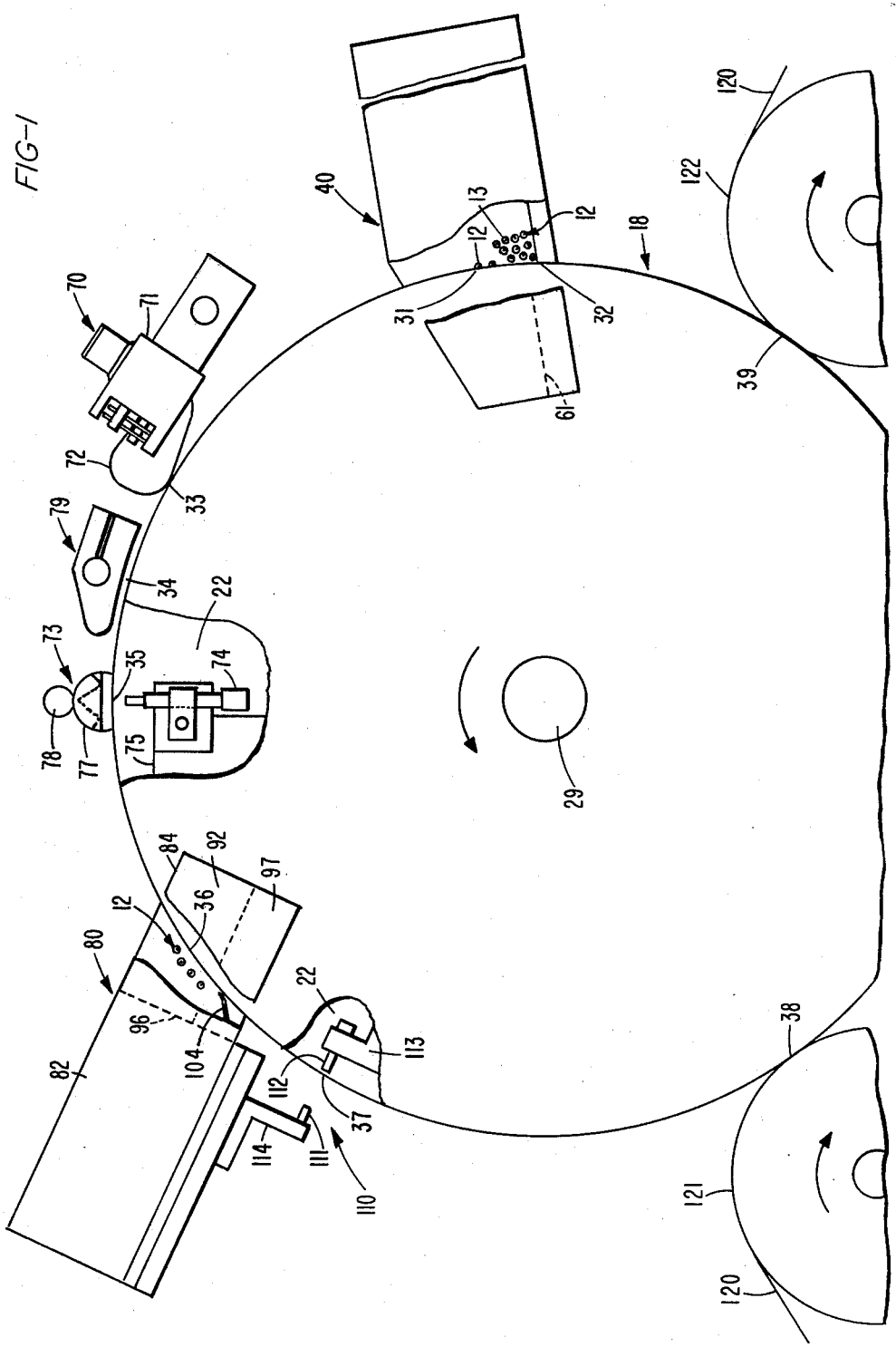
FIG. 1 is a partially cut-away elevation view of a typical carrier wheel for testing and taping axially leaded diodes including a loading bin for filling continuously occurring vacant positions and a make-up bin for filling randomly occurring vacant positions on the wheel in accordance with the instant invention.

It can be seen that certain elements in the figures are abbreviated or simplified to highlight certain features of the invention. Also, where appropriate, reference numerals have been repeated in the figures to designate the same or corresponding features in the drawing.

DETAILED DESCRIPTION

The Elongated Magnetic Articles

Figure 3:
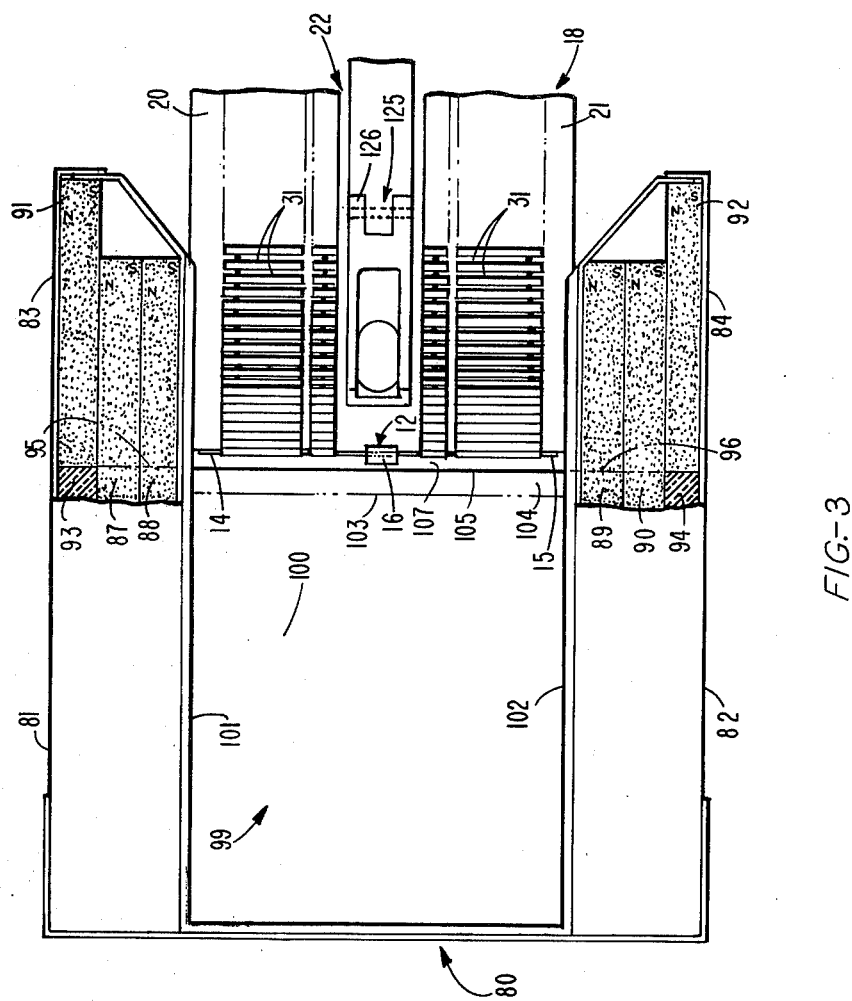
FIG. 3 is a plan view, partially in section, of the make-up bin shown in FIG. 1.

In FIGS. 1 and 3 there is shown at least one elongated magnetic article 12 which has been introduced into a vacant position on a carrier wheel. For purposes of illustration, the article 12 will often be identified and referred to as an axially leaded diode 12. However, it will be appreciated that other elongated magnetic articles 12 can as well be handled in the practice of the invention.

Referring again to FIG. 3, the diode 12 is seen to have wire-like leads 14 and 15 extending in opposite directions, typically in a collinear manner, from a generally central body 16. In an illustrative example, which will be used hereinafter unless otherwise specified, a typical diode 12 will be assumed to be about 3.375 inches long and weigh about 0.243 grams. Each lead 14 or 15 is about 0.020 inches in diameter and about 1.563 inches long. The body 16 is cylindrical in shape, being about 0.120 inches in diameter and about 0.250 inches long.

The body 16 contains an electronic device (not shown) which has a cathode connected to one external lead such as lead 14 and, in this example, an anode connected to the other external lead 15. The diode 12 is thus directionally sensitive from a polarity standpoint although such polarity typically cannot be discerned by visual observation of the shape of the diode 12.

The leads 14 and 15 and parts of diode 12 within the body 16 are made of a magnetic material, i.e., a material which is attracted to a magnet. Therefore, the diode 12 is affected by magnetic forces and magnetic means are advantageously used to manipulate such diodes.

The Taping Operation

Figure 2:
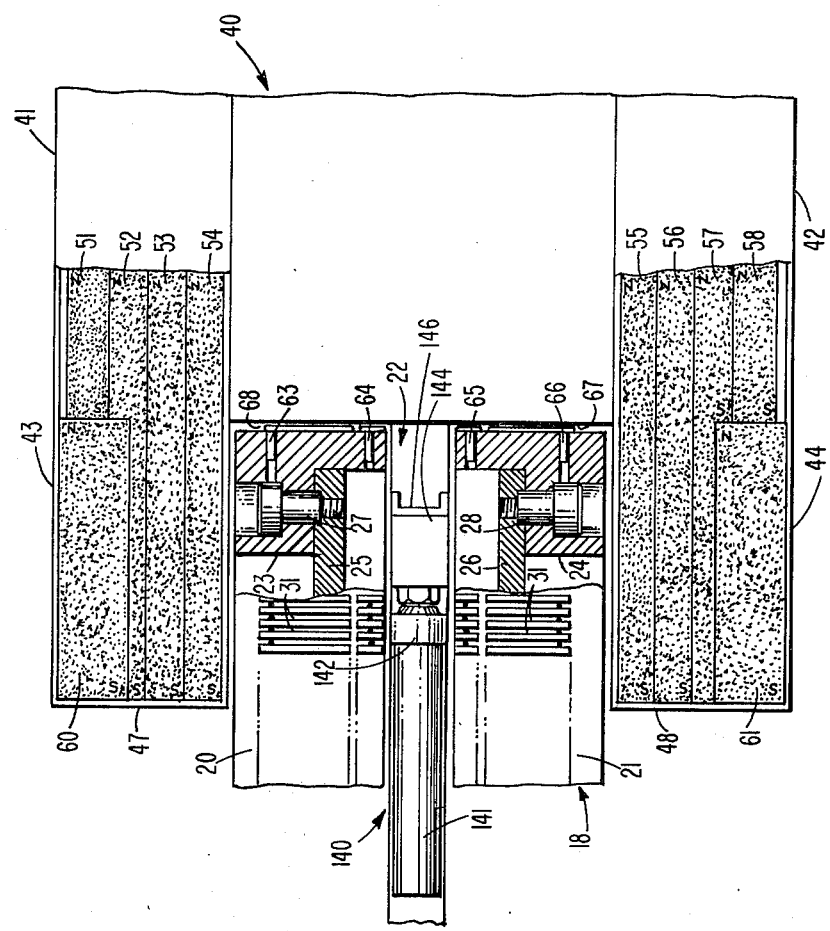
FIG. 2 is a foreshortened plan view, partially in section, of the loading bin shown in FIG. 1.

Referring to FIG. 1, an operation can be seen for testing and taping axially leaded diodes 12 on a vertically disposed carrier wheel designated generally by the numeral 18. Referring to FIG. 2, it can be seen that wheel 18 is comprised of separated portions 20 and 21 and a center area designated generally by the numeral 22. Portions 20 and 21 are further comprised of plastic rims 23 and 24, respectively, which are attached to aluminum discs 25 and 26, respectively, by stainless steel shoulder screws 27 and 28. The discs 25 and 26 are affixed to a shaft 29 shown in FIG. 1, by which wheel 18 is rotated in a counterclockwise direction.

It will be seen hereinafter that several features of the operation are located in center area 22 of wheel 18 although such features do not rotate with the wheel 18, there being one or more fixed mounting plates (not all shown) to support such features in center area 22. It can also be seen that the plastic rims 23 and 24 have grooves 31 which serve as nesting positions for the leads 14 and 15 of a diode 12 whereby the body 16 is suspended over center area 22. Nesting positions 31 are located about 0.200 inches on center such that the diodes 12 are carried in a closely spaced parallel relationship on the periphery of wheel 18.

Discrete steps in the taping operation take place at designated locations on a circle formed by the periphery of wheel 18, as shown in FIG. 1. Initially the diodes 12 are loaded into vacant positions 31 at a location 32 by use of a newly improved loading bin 40. It should be noted at location 32 that the vacant positions 31 occur on a continuous basis as the periphery of the wheel 18 is moved in an ascendent path. These circumstances facilitate the introduction of diodes 12 into the positions 31 on the periphery of wheel 18 as will be explained in more detail hereinafter. The circumferential surface of wheel 18 which carries diodes 12 will be hereinafter included under the broader term "periphery" since it will be appreciated that a carrier need not be a wheel 18 and could, for example, be a track which carries diodes 12 on the periphery thereof.

As the periphery of the wheel 18 advances to and beyond location 32, the positions 31 become substantially filled with diodes 12 and possibly an occasional unacceptable diode designated by the numeral 13. At a subsequent location 33 on the peripheral circle there is disposed a testing station designated generally by the numeral 70. Station 70 is comprised of a housing 71 containing testing circuits and switching gear and a pair of contacts 72 (only one shown). The station 70 tests for the presence of a good diode 12, for shorted or opened diodes 13 and for diodes having reversed polarity. However, the diodes 12 which are loaded onto the wheel 18 have been thoroughly tested prior to the taping operation. Therefore, shorts or opens are practically non-occurring and typically less than 1% of the diodes are of reversed polarity. Consequently, the function of the station 70 is primarily to sense and count diodes 12 and vacant positions 31 and to signal the removal of diodes 13.

When a diode 13 is to be removed, a signal is sent to a removal station disposed at a location 35 on the peripheral circle and designated generally by the numeral 73. The removal mechanism is believed to be thoroughly described in the incorporated application. It is sufficient here to note that station 73 includes an ejector mechanism 74, mounted to a fixed plate 75, shown in the center area 22 of wheel 18 by use of a cut away line. Mechanism 74 ejects an unacceptable diode 13 upward where it is captured by an inverted "V" shaped trough 77 and held therein by a magnet 78. Then the diode 13 is propelled by means (not shown) and redirected to the loading bin 40 or to a sorter mechanism. Such removal is facilitated by a centering device 79 which is disposed at location 34 for urging the diodes back and forth in a direction parallel to axle 29 to position the diodes substantially in the center of the positions 31 on wheel 18.

Removal of diodes 13 at station 73 creates randomly occurring vacant positions 31 which are filled at a location 36 on the peripheral circle formed by wheel 18. A novel make-up bin designated generally by the numeral 80 is provided to introduce diodes 12 into the vacant positions 31 which are advanced therefore in a descendant path through the bin 80 as will be explained in more detail hereinafter.

At a subsequent location 37 on the peripheral circle formed by wheel 18 there is provided a station designated generally by the numeral 110, for detecting vacant positions 31 which may happen to pass through bin 80 without being filled. Station 110 comprises a photocell component 111 mounted to a bracket 114 and a complimentary photocell component 112 mounted to a bracket 113. A cut away line has been provided to show that component 112 is mounted in the center area 22 of wheel 18. Preferably components 111 and 112 are aimed across a path formed by the bodies 16 of diodes 12 whereby the absence of a body 16 in a position 31 is sensed and whereby controls (not shown) stop the rotation of wheel 18. It will be seen hereinafter that not many vacant positions pass to location 37 in the practice of the invention. Nevertheless, station 110 is provided as a safety measure to be sure that all positions are filled for taping even though filling at location 37 may be done manually.

A tape system 120 is shown being guided by a contact roller 121 and a removal roller 122 along the bottom periphery of the wheel 18. Usually tape system 120 comprises two elements having adhesive sides which contact the wheel 18 at peripheral circle location 38 and continue in contact therewith until location 39 is reached whereby roller 122 guides tape 120 away from wheel 18. One element of tape 120 contacts each lead 14 of the diodes 12 while the other element contacts each lead 15 of such diodes. The tape 120 is then passed between roller 122 and another roller (not shown) which adds another tape element to each of the two elements of tape system 120 so that exposed adhesive surfaces are avoided.

The Loading Bin

Magnetic bins have been conventionally used to load magnetic, axially leaded diodes onto a wheel for manufacturing operations. Heretofore, such bins typically included a magnetic field established between and transverse to the sidewalls to orient and suspend diodes therebetween. The periphery of a wheel was usually disposed slightly within the forward boundary of the magnetic field because it was known to be difficult to force the diodes across such a boundary. The bins were typically inclined toward the wheel such that the diodes were urged by the force of gravity to enter into slots or grooves provided on the periphery to accept the diodes. Appropriate seating forces were obtained on the wheel by providing magnets in each groove where diodes were expected to be positioned thereon.

For moderate rates of position advancement, and where high efficiency in filling the positions has not been critical, the conventional magnetic bins have been satisfactory. However, at loading rates of 60,000 to 70,000 per hour, efficiencies have been typically in the range of about 70 percent using the bins described above and such range of efficiencies is no longer acceptable, particularly in a taping operation. Moreover, efforts to further urge the diodes forward within the bins by conventional means applied along or outside the periphery of the wheel have not produced the desired results. It has now been found, however, that means selectively applied substantially beyond the periphery of the wheel and along the sides thereof, will provide the results desired.

Referring again to FIG. 2, it will be seen that bin 40 includes a storage end having sidewalls 41 and 42 and a feed end having sidewall arm sections 43 and 44 which taper downward as seen in FIG. 1, to ends 47 and 48, respectively, as seen in FIG. 2. Sections 43 and 44 are cut away to reveal vertically disposed, bar magnets 51–54 which extend for substantially the full length of sections 41 and 43 and bar magnets 55–58 similarly disposed in sections 42 and 44. Magnets 51–58 are each about 0.375 inches thick in the example shown, thus providing a composite magnetic member which is about 1.500 inches thick in each sidewall. Since the magnets 51–58 are magnetized in the direction of their thickness, the pole distance for each composite magnet is about 1.500 inches.

Magnets 51–58 establish a first magnetic field between and transverse to the bin sidewalls of sufficient strength relative to the weight and material of the diodes to orient and suspend such diodes within bin 40. Moreover, bin 40 is inclined from about 10 to about 15 degrees from a horizontal plane toward wheel 18, so the diodes tend to congregate at the periphery of the wheel. However, it has been known that the lines of flux crossing the bin tend to concentrate in the magnetic material of the individual diodes causing each diode to be at least temporarily magnetized by induction. At any given point along the length of a diode 12, it is of the same polarity as an adjacent diode. Therefore, when the diodes 12 are suspended within a magnetic bin such as bin 40, such diodes tend to repel one another and resist being urged into a dense pattern. In a strong magnetic field such as that established by magnets 51–58, the diode repelling forces become particularly evident and a dense pattern is more difficult to obtain. However, the strong first magnetic field is established within bin 40 to facilitate loading the bin itself from handling trays in accordance with a procedure which is explained in an article entitled, "Moving Articles Through Descending Magnetic Fields," Western Electric, *technical digest*, No. 57, January 1980, Page 1.

A pattern of densely arranged diodes in a magnetic field has been attained by establishing a second stronger magnetic field in a region adjacent to and outside the periphery of a transport wheel. For example, a pending application, Ser. No. 72,255, assigned to the assignee of this application, describes such a procedure for transferring and transporting articles for lead straightening. However, it is believed that such a second field has not heretofore been established substantially within the periphery of a transport wheel to handle diodes for many reasons. For example, many transport wheels have metallic components which are disposed within the periphery of such wheels which are conventionally thought to distort magnetic flux lines and make them too incoherent for proper diode control. It has been found, however, that such a second field can be of unexpected benefit under certain circumstances.

Referring again to FIG. 2, it will be noted at end 47 of sidewall arm section 43 that bar magnets 51 and 52 have been cut out to receive a thick ceramic magnet 60. Note also that the opposite hand section 44 has also been modified by cutting magnets 57 and 58 to receive a similar ceramic magnet 61. Magnets 60 and 61 are about 1.000 inch high by about 2.500 inches long and each is about 0.625 inches thick. They are preferably made of a barium-iron oxide material and a ferrite material called "vectolite" incorporated into a ceramic casting. Magnets made of these materials having a desired residual magnetization are sold by Indiana General Company, a Division of Electronic Memories and Magnetics Corporation, Valparaiso, Ind., under the trade designation "Index 1."

Referring to FIG. 1, it can be seen that the second magnetic field established primarily by magnets 61 and 60 (opposite side) is established substantially within the periphery of the carrier wheel 18 and such field is located in a lower region of arm sections 43 and 44. Note that such an arrangement causes the diodes 12 to be introduced into vacant positions 31 at a location 32 which is in a desirably lower portion of the loading bin 40.

Certain other aspects and features of loading bin 40 contribute to the successfully loading of diodes 12 onto wheel 18. For example, it has been noted that the wheel positions 31 are advanced in an ascendent path through the bin 40 and that the positions 31 occur in a continuously vacant manner. Therefore, diodes 12 in the bin 40 which become slightly entangled with ones on the wheel 18 typically fall back into the bin 40 or into positions 31 by gravity. Also by reference to FIG. 2, it can be seen that the bin floor has an end 67 which is disposed in close proximity to the periphery of wheel 18 because the continuously occurring vacant positions 31 do not contain diodes 12 which would collide with such a proximate end 67. Therefore, a clearance space 68 precludes diodes 12 from being displaced downward and out of bin 40. Also, note incidentally, that four pin magnets 63–66 are provided in each position 31 to hold a diode 12 after it has entered therein.

In operation of the loading bin 40, the continuously occurring vacant positions 31 are advanced by carrier wheel 18 in an ascendent path in communication with the diodes 12. Such diodes 12 are easily moved from the storage end to the feed end of bin 40 by the force of gravity because a first magnetic field is established between and transverse to sidewalls 41 and 42 of sufficient strength relative to the weight and material of the diodes to orient and suspend the diodes 12 between the sidewalls and permit such diodes to be readily translated. At the periphery of the wheel 18, there is established between and transverse to the forwardly disposed, sidewall arm sections 43 and 44, a second magnetic field of sufficient strength relative to the weight and material of the diodes and the conditions on the wheel 18 to introduce such articles into the vacant positions 31 on the wheel 18. The conditions referred to on the wheel 18 include, but are not limited to, the speed at which the periphery is advanced, vibration conditions, the arrangement of diodes 12 outside the periphery in any given pattern, the availability of air jets if needed to disentangle the diodes 12 or to rotate a pattern of diodes, the conditions in the position grooves, including magnets 63–66, the "tight" spacing of positions 31, whether adjacent positions 31 are filled with diodes 12, and other conditions which enhance or preclude entry of diodes 12 into the positions 31.

It will be noted that the materials preferably used for the components of wheel 18 are either plastic or of relatively non-magnetic metal. Consequently, the flux lines established between the magnets 60 and 61 would be expected to be reasonably linear and coherent. It is believed, however, that the lack of magnetically permeable materials within the periphery of the wheel 18, serves to avoid having flux drawn directly between the pole faces of magnets 60 and 61 where such flux would be unavailable for diode control at the wheel positions 31. It will be observed that a small portion of each such magnet extends to the wheel positions 31 to provide a strong magnetic boundary which traps the diodes 12 in the vicinity of the positions 31. Such boundary can, of course, be adjusted outward or inward of the periphery of the carrier to obtain optimal results.

It is further theorized that the diodes in the vicinity of and within the positions 31 become strongly magnetized on a temporary basis by induction from magnets 60 and 61. Since the diodes 12 comprise the most magnetically permeable material at the periphery, it is believed that the flux lines are drawn from a significant area of a pole face of one magnet, that the flux is conducted across the wheel positions 31 by the diodes 12, and that the flux returns to an opposite pole face of the other magnet. The flux is thus thought to "wrap around" the peripheral area of the wheel and bind the diodes 12 into the positions 31 where they become nested upon the position magnets 63–66. The results seem to indicate that forces similar to those theorized are present in the practice of the invention. Using this arrangement, it has been found that loading rates in the range of about 70,000 per hour can be attained with efficiencies of about 99 to about 100 percent.

The Make-Up Bin

In the taping operation shown in FIG. 1, about 7,000 diodes are tested and taped and are thus wound upon a spool for shipment. Typically, during such a run, 1% or less of the positions 31 which are advanced beyond removal station 73 are found to be vacant on a randomly occurring basis. The problem is to fill such vacant positions 31 while they are advanced in a descendent path without dislodging adjacent diodes 12 which have been successfully tested and are ready for taping.

Referring to FIG. 3, there is shown a magnetic bin 80 which could be considered analogous to bin 40 shown in FIG. 2. Bin 80 includes a storage end having sidewall sections 81 and 82 and a feed end having sidewall arm sections 83 and 84. Cut away lines in sidewall sections 81 and 82 reveal systems of magnets in said sidewalls which are similar but which are of opposite polarity.

Vertically disposed bar magnets 87 and 88 extend for substantially the full length of sidewall section 81 and an arm section 83. In a similar manner, bar magnets 89 and 90 extend for substantially the full length of sidewall section 82 and an arm section 84. Magnets 87–90 are similar in thickness, polarity, and material as the magnets 51–58 found in bin 40 except that the pole distance for each composite magnets 87–88 or 89–90 is only 0.750 inches, about one-half of that found in bin 40. The procedure for loading bin 80 is different than that for loading bin 40 so there is no need to establish such a strong magnetic field in the storage end of bin 80.

Magnets 87–90 establish between and transverse to the sidewalls of bin 80, a first magnetic field of sufficient strength relative to the weight and material of the diodes 12 to orient and freely suspend such diodes within bin 80. To urge the diodes 12 forward from the storage end to the feed end, bin 80 is inclined about 25 degrees from a horizontal plane, toward wheel 18. It is found that the diodes 12 in bin 80 also resist being compressed into a tight pattern at wheel 18, although not to the same extent as is found in bin 40 because the force field here is weaker and therefore the magnetism induced into each diode is less than that found in bin 40.

Referring again to FIG. 3, the sidewalls 81 and 82 at the storage end of bin 80 are theoretically divided by lines 95 and 96, respectively, from the arm sidewalls 83 and 84 at the feed end of bin 40. An additional magnet 91 is provided at section 83 and a similar opposing magnet 92 is provided at section 84. A filler plate 93 of non-magnetic material such as a plastic is provided in section 81 and a similar plate 94 is provided in section 82.

By reference to FIG. 1 and FIG. 3, it can be seen that magnets 87–90 in the storage end of bin 80 extend for the full depth of the sidewalls 81 and 82. However, the magnets 91–92 and extended portions of magnets 87–90 at the feed end of bin 80 extend for substantially less than the full depth of arm sections 83 and 84. There is thus created a non-magnetic region 97 at the feed end of the bin 80 under the arm magnets and forward of lines 95 and 96.

In operation of the make-up bin 80, the randomly occurring vacant positions 31 are advanced by carrier wheel 18 in a descendent path in communication with the diodes 12 in bin 80. Note that the diodes 12 in the storage end of bin 80 are oriented and suspended in much the same manner as the diodes in bin 40. Moreover, the stored diodes 12 in bin 80 are also urged forward and congregate at the periphery of the wheel by the force of gravity although such diodes are less reluctant to form a dense pattern at wheel 18. Therefore, a second magnetic field in the forward sidewall arm sections 83 and 84 need be only moderately stronger than the first magnetic field in the storage end to draw the diodes 12 into the positions 31 on wheel 18. Such balance of strength between the first and second force fields, and particularly the moderately strong second field, is found to be desirable to avoid binding the diodes 12 too tightly against wheel 18. Otherwise, a vigorous introduction of a diode 12 into a randomly occurring vacant position 31 would risk dislodging adjacent diodes 12 which are properly nested in adjacent positions 31.

By further reference to FIG. 1, it can be seen that the positions 31 are advanced between and along the sidewall arm magnets and then through the non-magnetic region of the bin 80. Because the second magnetic field is located substantially within the periphery of wheel 18 and in an upper region of the arm sections 83 and 84 of bin 80, the diodes 12 are introduced into vacant positions 31 at the location 36 which is in a desirably upper portion of bin 80. Diodes 12 are urged from the first magnetic field in the storage end to the feed end of bin 80 by the force of gravity and by the attraction of the stronger, second magnetic field. Once the diodes 12 are within the second field, they tend to press against the periphery of wheel 18 but they normally tend to avoid moving downward through the boundary of the second field. Nevertheless, it is expected that episodes of movement by an errant diode 12 will occur, downward through the boundary of the second magnetic field due to mechanical drag-out or due to striking blows by advancement of wheel 18. Such episodes are assisted by the force of gravity although the lower region 97 is purposely made non-magnetic to avoid further pull on an errant diode 12 in a downward direction.

Referring again to FIGS. 1 and 3, a sheet metal liner 99 can be seen in bin 80 having a floor 100 and sidewalls 101 and 102. Such sidewalls are cut out along the periphery of wheel 18 to permit the arm magnets to be disposed close to the sides of the carrier wheel 18. The floor 100 extends toward the wheel 18 and has a break line 103 to permit a portion 104 of such floor 100 to be turned partially upward at the feed end of bin 80 ending at an edge 105. It is to be noted that a clearance space 107 between the edge 105 and wheel 18 is made just large enough to pass a diode 12. Typically, an errant diode 12 which is stricken from the second magnetic field will not pass through clearance 107 because diodes 12 in nests 31 substantially fill the clearance 107 and preclude passage of a second diode 12. Therefore, the upturned portion 104 of floor 100 substantially excludes diodes 12 from the non-magnetic region 97 and guides such diodes back to the first magnetic field.

Automatically Replenishing the Make-Up Bin

In the taping operation shown in FIG. 1, it is desirable to maintain a minimum of about 75 and a maximum of about 220 diodes 12 in make-up bin 80 for ideal performance. Manually counting and maintaining the supply of diodes 12 is time consuming and, therefore, costly. Consequently, a novel automatic replenishing system has been provided as shown in FIG. 4.

A cut away line reveals an off-the-wheel diverting mechanism disposed in the center area 22 of wheel 18 and designated generally by the numeral 125. Divertor 125 includes a camming member 126 which is pivotally mounted to a plate 127 and which is also pivotally mounted to a piston 128. Piston 128 is operated by a cylinder 129 which is further pivotally mounted to the plate 127 and which is timely actuated by compressed air means (not shown). Cam 126 is made somewhat wider than a body 16 of a diode 12 and a center recess 130 is provided in cam 126 such that a diode 12 will be supported on cam 126 by the leads 14 and 15 and not by the body 16.

Figure 4:
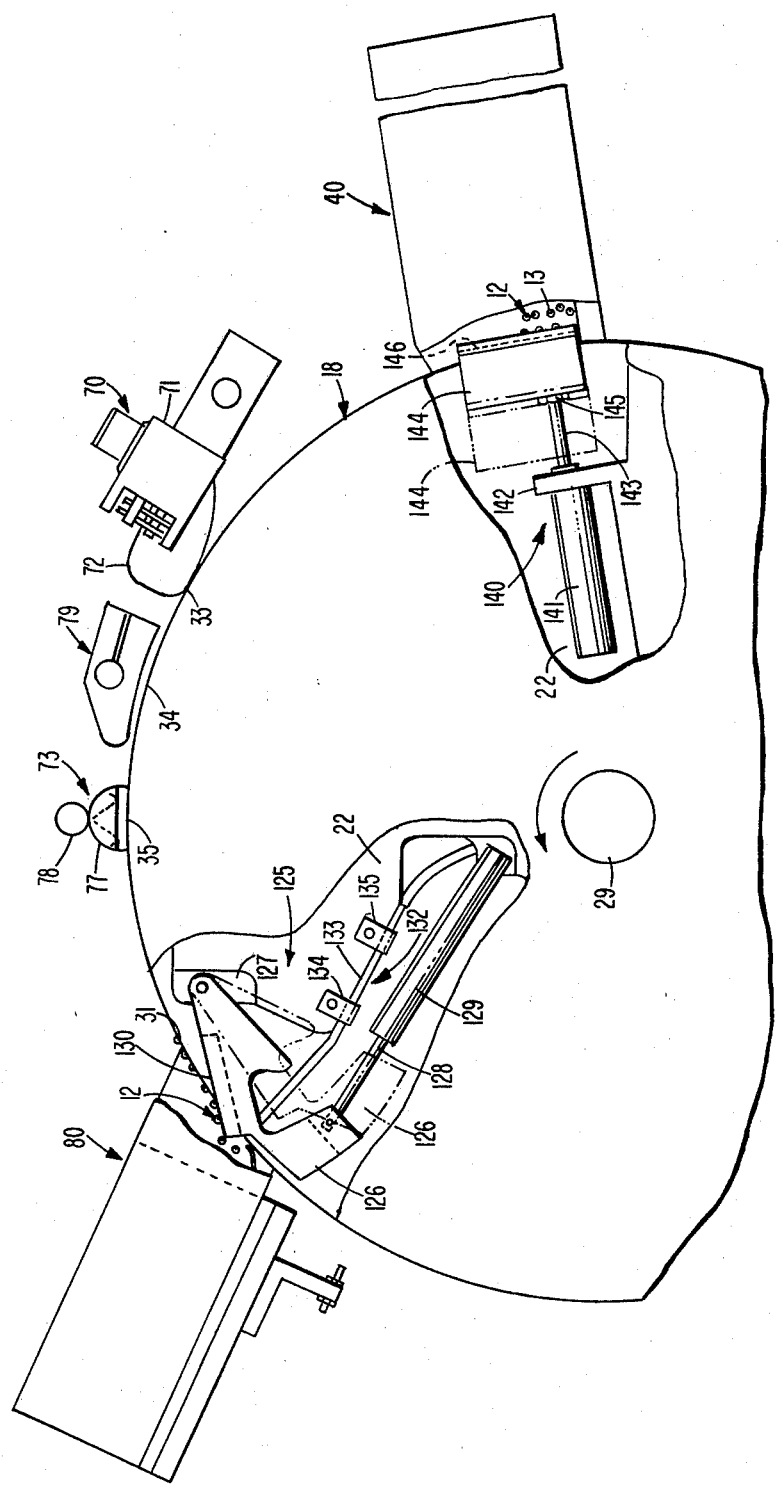
FIG. 4 is the view shown in FIG. 1, further cut away to show how the supply of diodes in the make-up bin is automatically replenished from diodes on the wheel.

Cam 126 is shown in its active mode in FIG. 4 whereby diodes 12 are advanced by wheel 18 in a descendent path to about the make-up location 36, previously noted in FIG. 1. At about location 36, each diode 12 becomes dislodged from its position 31 because the leads 14 and 15 bear upon the sides of recess 130 in cam 126 with the body 16 suspended within such recess. The diodes 12 are diverted into the strong second magnetic field of bin 80 and consequently, continuously occurring vacant positions 31 are advanced downward and away from bin 80. An air stream is provided by a jet 132 to aid in moving diodes 12 further into the bin 80. The jet 132 includes a tube 133 which is attached to plate 127 by brackets 134 and 135 and which is fed compressed air by means (not shown).

After the feed section of bin 80 becomes full, the diodes 12 are pushed into the storage end until bin 80 has been replenished with the proper number of diodes 12. Then, the unseen means actuates cylinder 129 to move piston 128 in a retractive direction and cam 126 is withdrawn to an inactive mode as shown by the phantom lines drawn within the cut away line. A top view of the diverting mechanism 125 is incidentally seen in its inactive mode in FIG. 3, wherein only cam 126 is seen disposed in center area 22, between wheel sections 20 and 21.

To Automatically Stop Loading the Carrier

At the beginning and at the end of each taping run, it is desirable to form a leading and a trailing portion, respectively, of the tape system 120 without the adherence therewithin of diodes 12. For these and other reasons, there are occasions when it is desirable to stop loading diodes 12 onto carrier wheel 18 and it is further desirable to do so automatically.

Means for stopping such loading can be seen in FIG. 4 where a cut away line reveals a blocking mechanism disposed in the center area 22 of wheel 18 and designated generally by the numeral 140. Blocking mechanism 140 includes a cylinder 141 which is fixedly attached to a mounting plate 142 and translates a piston 143 in response to compressed air means (not shown). A rectangular blocking member 144 is attached to piston 143 and fixed thereto by a jam nut 145. Member 144 is machined at its active end to form a recess 146 which is large enough to at least receive the bodies 16 of diodes 12 so that the leads 14 and 15 contact the sides of the recess and avoid damage to such bodies 16.

The blocking mechanism 140 is shown in its active mode in FIG. 4 whereby the forward edge of member 144 is translated beyond the periphery of wheel 18 sufficiently to block progress of diodes 12 toward wheel 18 in bin 40. In this condition, wheel 18 can continue to rotate and deliver already positioned diodes 12 to the taping locations 38-39 or to the make-up bin 80, depending upon the needs therefor without taking on more diodes 12. When loading is again desired, the unseen air means is appropriately actuated whereby cylinder 141 retracts piston 143 and member 144 so diodes 12 are again urged forward to wheel 18.

Controlling The Taping Operation

Although the present invention can be practiced with the aid of conventional controls, it is preferred to exploit the greater speed and versatility of a programmable, general purpose, microprocessor, for example, an EPROM Microcomputer sold by Intel Corporation of Santa Clara, California as its Model No. 8748.

A preferred, abbreviated program comprising typical loops and subroutines for operating said microprocessor is represented in the flow charts shown in FIGS. 5-13. The flow charts comprise a number of process blocks (PB) and decisional blocks (DB) representing respective microprocessor operations. Standard programming techniques, known in the art, can be employed to reduce the flow charts of FIGS. 5-13 into equivalent machine language in a known manner. It will be recognized that only the process-oriented portion of the overall program is represented by FIGS. 5-13. In addition there is provided the customary system software including, for example, machine control, which are well known and not required for an understanding of the invention.

Figure 5:
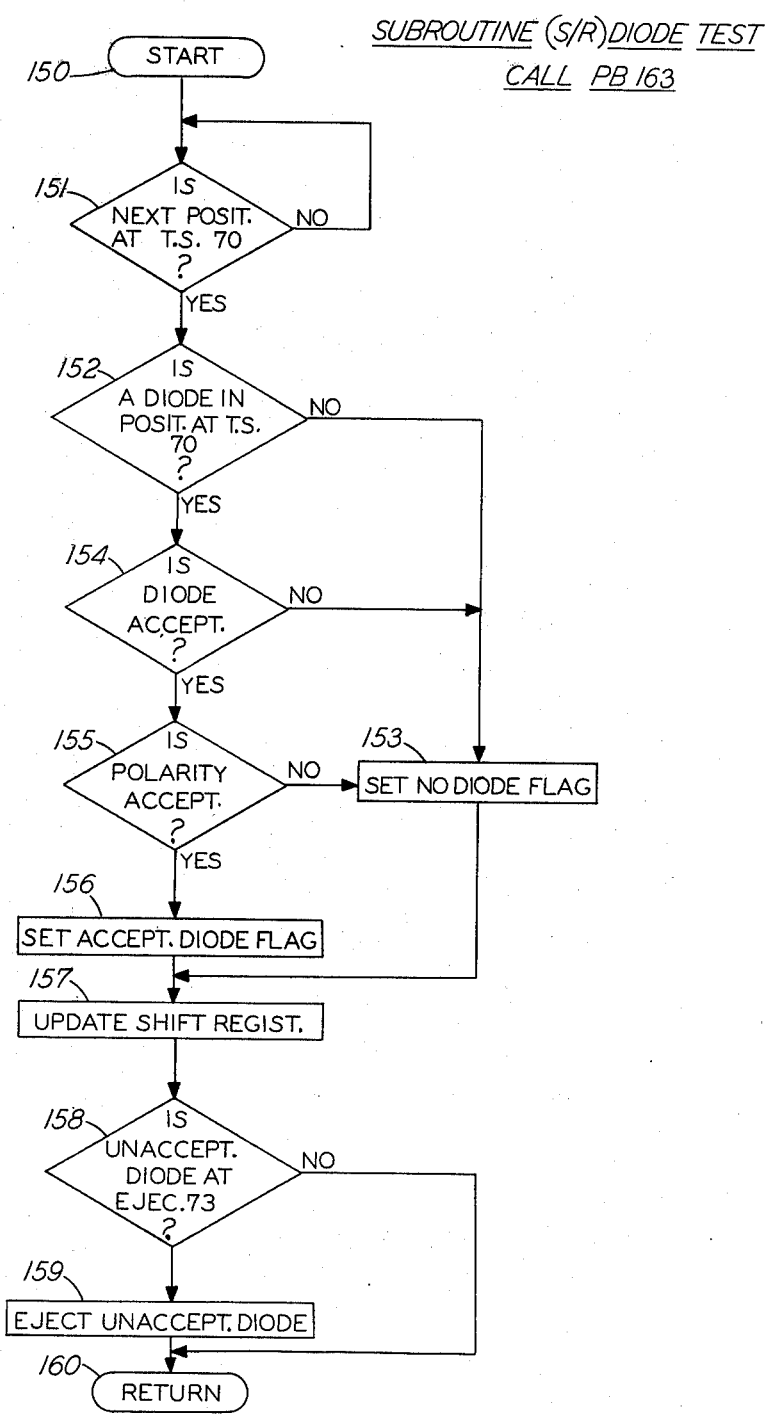
FIGS. 5-13 are flow charts of a routine by which a microprocessor controls a testing and taping operation.

Referring to FIG. 5, there is seen a subroutine (S/R) chart for performing a S/R "Diode Test" starting at a circuit terminal represented by a flat oval 150. A data field in storage is examined according to decisional block 151 (DB 151) to determine whether a next position 31 is under the test contacts 72 of testing station 70 (T.S. 70), as shown in FIG. 1. Upon an affirmative decision, a similar examination is made according to DB 152 to determine whether a diode 12 is present in the position 31 at T.S. 70. Upon a negative decision at DB 152, a "no diode" flag is set according to process block 153 (PB 153) to store information in a shift register. Upon an affirmative decision, another examination is made according to DB 154 to determine if the diode which is present in position 31 is an acceptable diode 12. If the decision is negative, a "no diode" flag is set according to PB 153 as explained above. If the decision is affirmative according to DB 154, an examination is made, according to DB 155, to determine proper polarity of the given diode 12. If the decision is negative, indicating reversed polarity, a negative flag is set according to PB 153 as explained above. If the decision is affirmative, an acceptable diode flag is set according to PB 156. It will be appreciated that the flag set according to PB 153 and PB 156 can be the same flag but the setting would reflect an opposite instruction in updating a register according to PB 157.

Another data field is then examined according to DB 158 to determine if an unacceptable diode 13 is then at the ejecting station 73. If there is, such diode 13 is ejected according to PB 159 but if the answer is negative, PB 159 is by-passed as shown. The processor then returns from a circuit terminal represented by a flat oval 160 to either another subroutine (S/R) as shown in FIG. 6 or to the main program represented by the charts shown in FIGS. 9-13.

Figure 6:
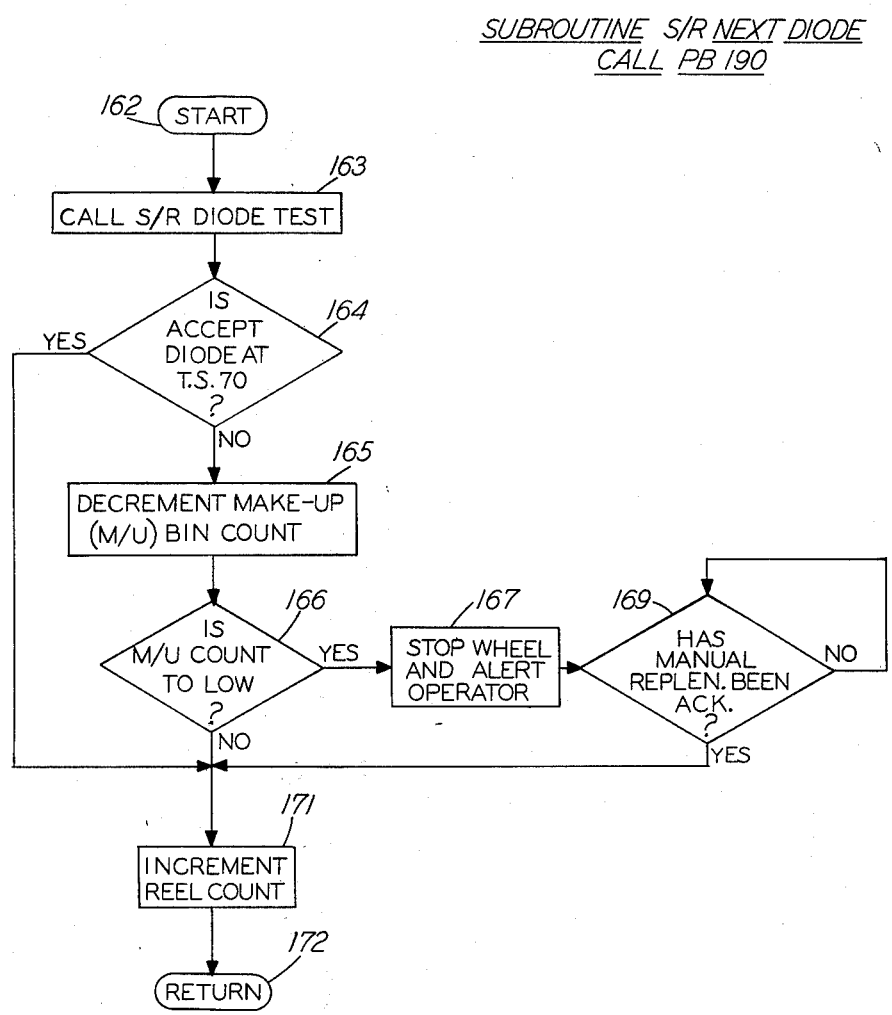

Referring to FIG. 6, there is seen an S/R chart for performing an S/R "Next Diode" step which is basic to the program. Such step includes the previously described Diode Test which machine senses each position and each diode as the carrier wheel advances the same to and beyond T.S. 70. The Next Diode step then uses the test results to supervise the make-up (M/U) bin count and the reel count.

The number of articles needed for M/U in an operational run is obtained by machine adding the number of vacant positions 31 which pass the testing location 33 to the number of unacceptable diodes 13 which also pass thereby since such diodes 13 are machine ejected at location 35 leaving more vacant positions. All such vacant positions 31 are filled at location 36 by introducing diodes 12 therewithin from the M/U bin 80. Since the M/U bin 80 typically starts with about 220 diodes, the Next Diode step decrements a M/U count until a low of about 75 is reached which is typically considered too low for maximally efficient operation. If an operation includes more diodes 13 and vacant positions 31 than about 145 (the difference between the full count 220 and the low count 75), then the M/U bin 80 is manually replenished. Typically, an operation requires less than about 70 diodes 12 for M/U, at the end of the run, so the bin 80 is later replenished for the diodes 12 made-up during the run and such replenishment is done in a desirably automatic manner.

Figure 9:
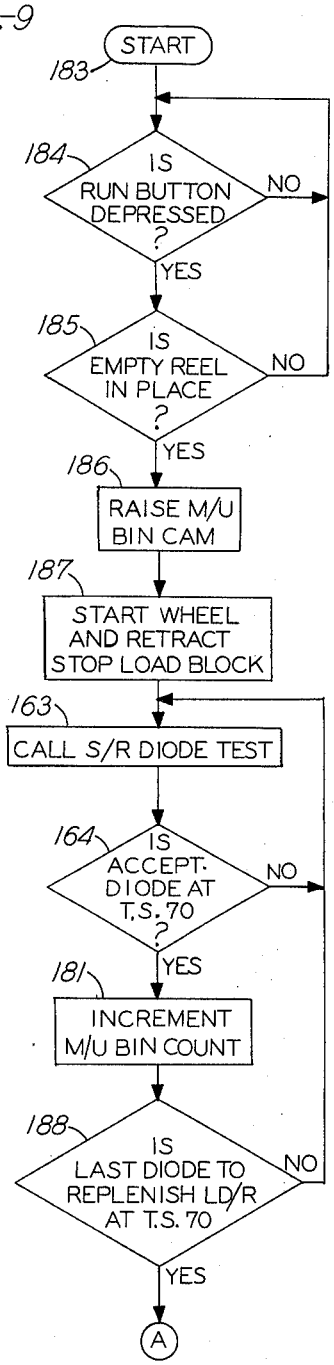

The S/R of FIG. 6 starts at a circuit terminal 162 whereupon the S/R Diode Test is called, according to PB 163 (FIG. 5), to machine sense a position 31 and usually a diode within the position 31 using the program described by reference to FIG. 5. A data field is then examined according to DB 164 to determine if an acceptable diode 12 has been sensed at T.S. 70. Upon an affirmative decision a by-pass is made to PB 171, but upon a negative decision the M/U bin count is decremented according to PB 165 because a M/U diode 12 will typically be fed from bin 80 to fill the position 31. Examination is next made according to DB 166 to determine whether the M/U count is too low. If such count is low, a signal is sent to stop the wheel 18 and alert the operator according to PB 167. Thereafter, the operation does not continue until the operator acknowledges that the M/U bin has been manually replenished according to DB 169. Upon a by-pass decision from DB 164 or an affirmative decision from DB 169, the reel count is incremented according to PB 171. It will be appreciated that such reel count is incremented whether or not there is an acceptable diode 12 at test station 70. Such incrementing is consistent with the previously described taping operation, for example, because an unacceptable diode 13 is ejected during S/R Diode Test according to PB 163. This would leave a vacant position 31 so the decision according to DB 164 is made between the remaining alternatives, i.e., an acceptable diode 12 or a vacant position 31. Since a vacant position 31 is filled by M/U bin 80, all positions are ideally filled as they are advanced to the given operation and, therefore, the reel count is incremented for every position. In a typical taping run, an exact total count of acceptable diodes 12, for example, a count of 7000 diodes 12 is made and the processor then returns from a circuit terminal 172 to the main program (FIG. 9).

Figure 7:
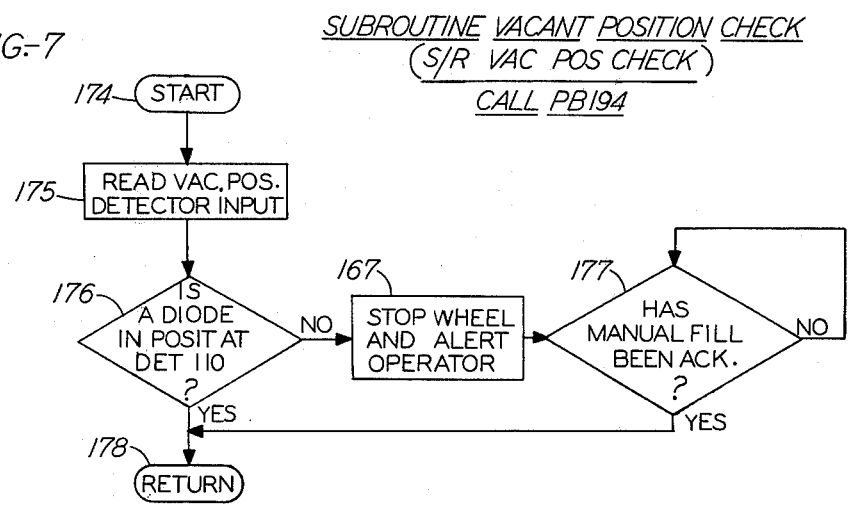

Referring to FIG. 7, there is seen a subroutine "Vacant Position Check" (S/R Vac. Pos. Check) for guarding against omitting diodes after a position 31 passes the M/U bin 80. Starting at a circuit terminal 174 the input to the processor from the detector 110 is then read according to PB 175 and a decision is made according to DB 176 as to whether a diode is in a position 31 at detector 110. If a diode is not in such position, the wheel 18 is stopped and the operator is alerted to manually fill the position and acknowledge the act according to DB 177. When a diode is in position or when such manual filling is acknowledged, the S/R is completed and the processor returns from circuit terminal 178 to the main routine. It will be appreciated that both S/R Vac. Pos. Check and S/R Next Diode are only called when diodes 12 are being supplied to a given operation, such as taping. They are not normally required for ancillary routines such as pre-operation or post-operation M/U bin replenishment which will be described hereinafter.

Figure 8:
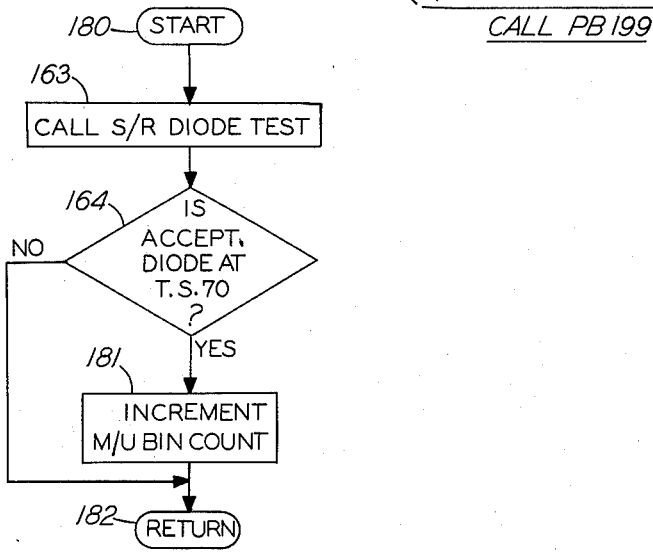

Referring to FIG. 8, there is seen an "S/R Replenish M/U Bin" which is called according to PB 199. The purpose of the subroutine is to machine control the apparatus which replenishes M/U bin 80 either at the beginning of a work period or at the end of each process run. Note that this S/R may control replenishing of up to about 145 diodes 12 at the end of a process run depending upon the condition of diodes which are loaded onto wheel 18 by bin 40 and also depending upon the efficiency of such loading. M/U bin 80 may have a practical working range of from about 75 to about 220 diodes 12 for maximally efficient operation so about 145 diodes are available to fill vacant positions 31. However, the post-operational routine for a process run is generally improved if M/U is limited to the number of diodes required to fill the positions 31 between loading location 32 and M/U location 36. Typically, wheel 18 is so designed that the number of positions 31 between loading and M/U is about 1% of the number of diodes 12 required by a given operation. In a typical taping operation, 7000 diodes are taped for one reel so about 70 positions are provided between loading and M/U. It is, therefore, desirable to limit the M/U requirement to 70 diodes and it is further desirable that the loading efficiency of bin 40 be about 99 to 100%. It will, therefore, be appreciated that there is relationship between the loading efficiency of bin 40 and the M/U capacity of bin 80 providing most of the diodes are acceptable.

Referring again to FIG. 8, the S/R starts at a circuit terminal represented by a flat oval 180. The S/R Diode Test is called according to PB 163 to determine availability and acceptability of a diode at T.S. 70 and to supervise removal of a diode 13 if such is necessary. A decision is then made according to DB 164 to determine if there is an acceptable diode 12 at T.S. 70. If a diode 12 is present, a M/U bin count is incremented according to PB 181, but if a diode 12 is not present, PB 181 is by-passed. The processor then returns from circuit terminal 182 to the main routine.

Referring to FIG. 9, there is seen a pre-operation routine for replenishing M/U bin 80, typically at the beginning of a manufacturing period. Such routine is made part of the main routine for a given operation such as taping because the wheel 18 is typically left in an empty condition during scheduled downtime.

Starting at a circuit terminal represented by a flat oval 183, data fields are examined according to DB 184 and DB 185 to be sure a "run" button has been depressed and an empty reel (not shown in FIG. 1 or 4) is in place near roller 122. Then the M/U bin divertor 125 shown in FIG. 4 is actuated so cam 126 is raised according to PB 186 to divert diodes 12 from wheel 18 into bin 80. A motor is started to rotate wheel 18 and mechanism 140 (shown in FIG. 4) is actuated to retract blocking member 144 according to PB 187. Diodes 12 and random diodes 13, if any, are thereupon urged into positions 31 and are successively advanced by wheel 18 to T.S. 70 where they are tested and counted. Thereafter, the next four instructions are successively repeated until the M/U bin count is brought up to its design level in filling bin 80.

The S/R Diode Test is called according to PB 163 and the results examined according to DB 164 to determine if an acceptable diode 12 is in position at T.S. 70. If the answer is negative, the S/R Diode Test is called again according to PB 163 to test a next position and usually a next diode, but if the answer is affirmative the M/U bin count is incremented according to PB 181 because the diode tested will be diverted into bin 80. Note in this part of the program that the M/U bin count could increment successively from 0 to about 220 because bin 80 could be empty in the pre-operational phase.

It will be appreciated that a count of the acceptable diodes 12 need not be maintained to machine make-up diodes on wheel 18 and to replenish M/U bin 80. Only the number of unacceptable diodes 13 and the number of vacant positions 31 bear upon the M/U count. Similarly, a reel count can also be maintained for taping without counting acceptable diodes 12 because all positions are to be filled beyond bin 80 and a position count would typically provide a proper reel count. However, it is desirable to identify the first acceptable diode 12 after the M/U count is obtained because such diode 12 marks the beginning of the reel count. Therefore, a data field is examined according to DB 188 to determine when the last diode 12 for replenishing (LD/R) is at T.S. 70 so a routine for supplying diodes for the given operation can begin.

Figure 10:
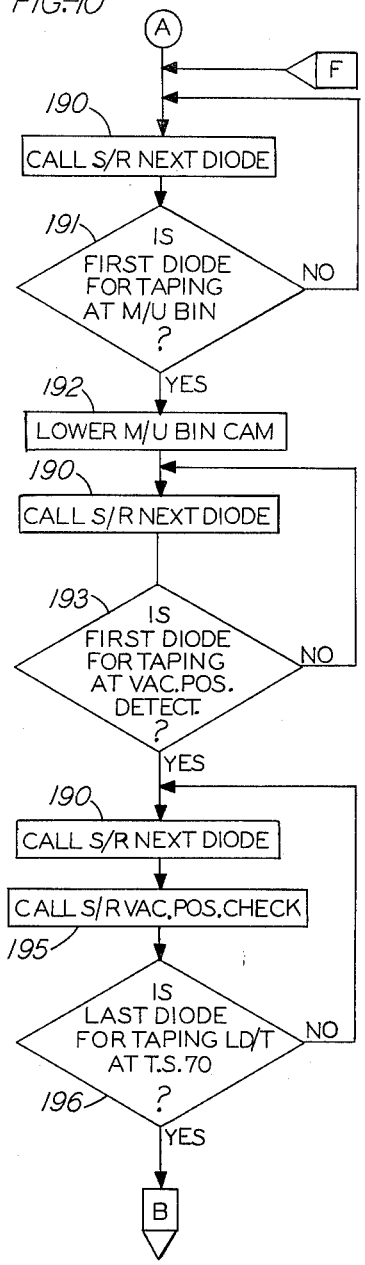

Referring to FIG. 10, a symbol "A" is noted, indicating an on-page connection to the prior routine; also a symbol "F" is noted, indicating an off-page connection, which will be explained later. The S/R Next Diode is next called according to PB 190 to identify the first diode 12 for taping according to DB 164 and to initiate incrementing the reel count according to PB 171, all as shown in FIG. 6.

It will be appreciated that a clean demarcation is to be made between the last diode for replenishing (LD/R) and the first diode 12 for taping. Once cam 126 is lowered, diodes 12 are advanced for taping, such diodes having been loaded by loading bin 40 or having been introduced into vacant positions by M/U bin 80. Therefore, the positions 31 passing the T.S. 70 after the LD/R are counted and compared with a known number of positions between T.S. 70 and M/U bin 80. When equivalence is reached the first diode to be taped has just reached the M/U bin 80 and the cam 126 is lowered to start the taping run. DB 191 and PB 192 provide the routine to control initializing the taping function in the manner described.

To control machine functions by reference to T.S. 70, an ad hoc machine count of positions 31 is made between locations 32–39. Accordingly, such a count is used to determine when the first diode 12 for taping is at the vacant position detector 110 in accordance with PB 193. The photocell in the detector 110 is then energized and thereafter a call is repetitively made to S/R Next Diode and S/R Vac. Pos. Check according to PB 190 and PB 195 until the full number of diodes 12 for taping passes T.S. 70. The count of diodes thus supplied to the taping operation is obtained, according to a preferred method, by adding the number of acceptable diodes 12 sensed at T.S. 70 to the number of M/U diodes presumptively fed from bin 80 because such numbers are available at any instant. The M/U diode number is obtained by subtracting the decremented M/U count from the full count of diodes in bin 80 at the start of the run. Such M/U number is considered presumptive because a vacant position may get by bin 80 without getting machine filled.

By machine comparing the number of diodes supplied from beyond T.S. 70 with a desired number of such diodes, a last position 31 is identified at T.S. 70 which will advance a last required diode 12 for taping (LD/T) to the given operation. At this point a post-operation routine is begun which includes completing the given operation.

The functions in the post-operation routine include advancing a last acceptable diode for taping (LD/T) past the divertor 125, raising cam 126 to stop advancing diodes 12, replenishing bin 80, stopping the loading of diodes 12 on wheel 18, developing a trailer tape and stopping the rotation of wheel 18. These functions generally are triggered by one of four separate events as follows: (1) when the last diode for replenishment (LD/R) is loaded on wheel 18, (2) when the last diode for taping (LD/T) passes the M/U bin 80, (3) when the LD/T passes detector 110, and/or (4) when sufficient positions have passed T.S. 70 to develop a given length of trailer tape. The problem is that event (1) can happen at a random moment before or after events (2) or (3). Normally, the needed count for replenishment is less than the number of potentially acceptable diodes presumed to occur between the loading bin and the LD/T. If the needed count for replenishment is above normal, then event (1) could happen after (2) or after (3) or between (2) and (3). Therefore, alternate paths of routine are provided in FIGS. 11–12 to supervise these events and provide instruction accordingly.

Figure 11:
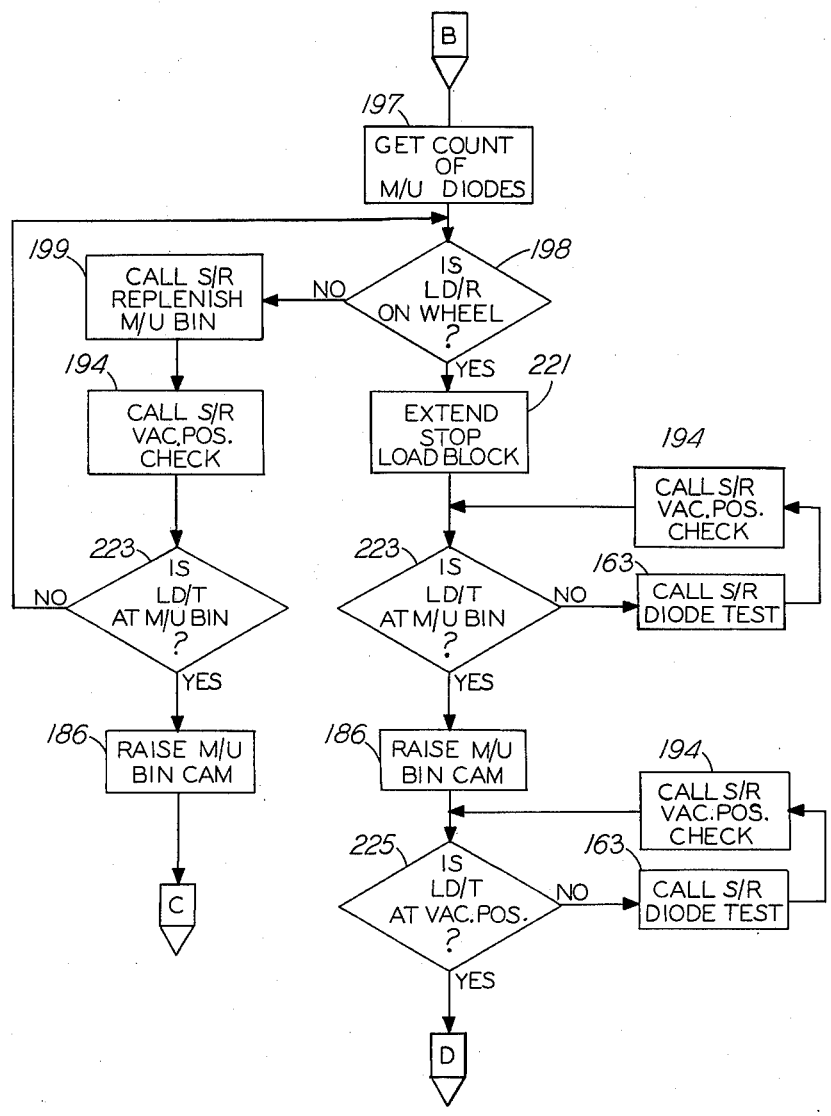
Figure 12:
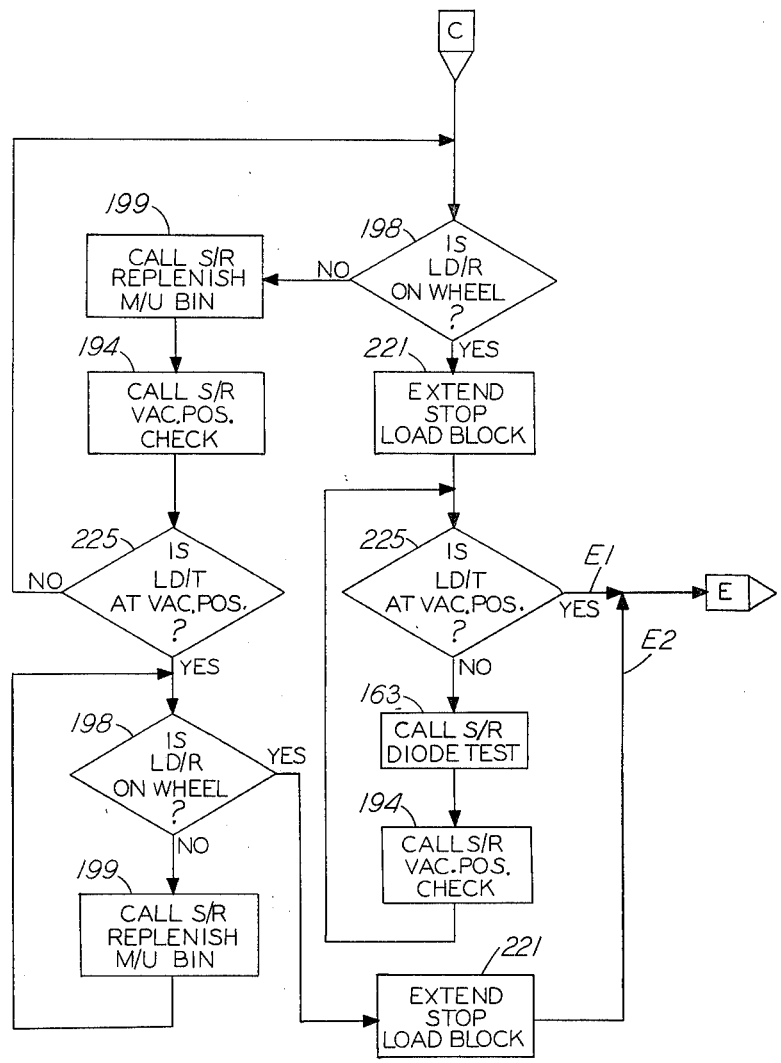
Figure 13:
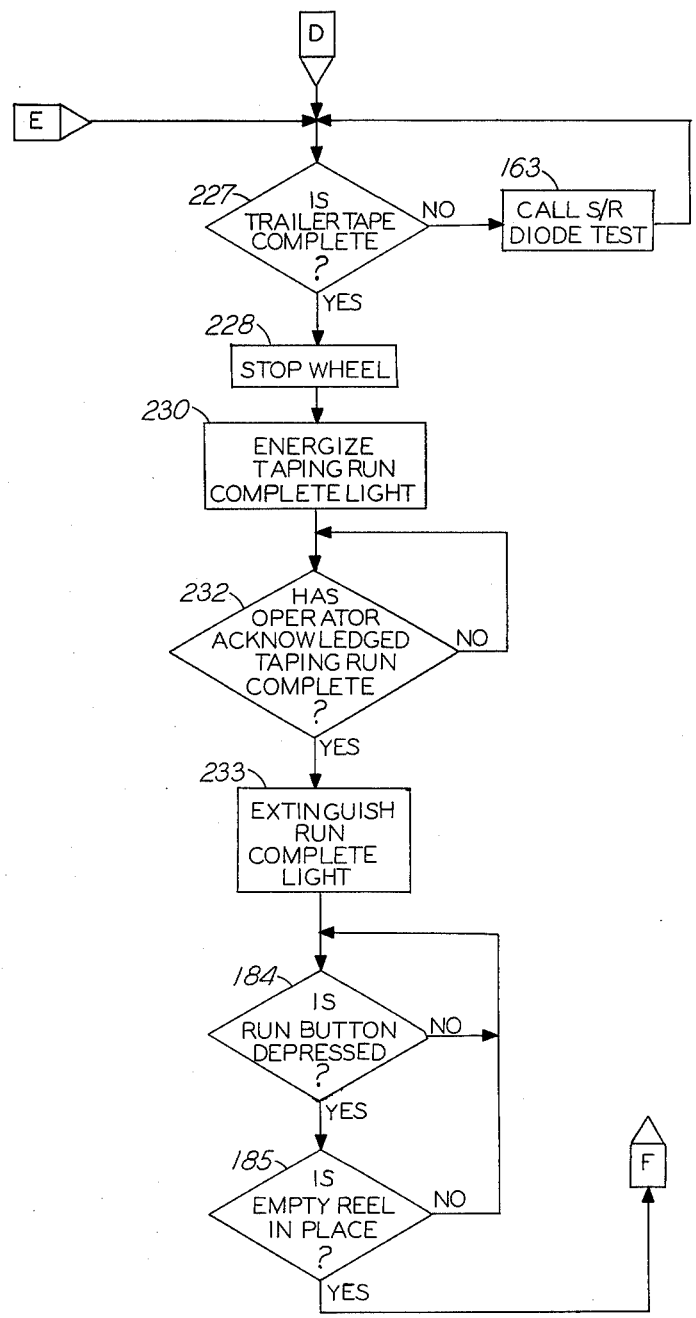

Referring to FIGS. 11 and 12, the post-operational phase of routine begins after off-page connector "B" by obtaining the count of M/U diodes according to PB 197 and determining, from such count, the number of diodes 12 presumptively fed from bin 80. This number will be used to replenish bin 80 according to an empirical procedure as will be explained hereinafter. However, to better understand the routine it is useful to note that alternate paths are used to denote alternate instruction depending upon the replenishment number. For example, if such number is normal so the LD/R is loaded on wheel 18 before the LD/T passes the M/U bin 80, the path of routine lying between connectors B-D is used. If the replenishing count is slightly high so the LD/R is loaded on wheel 18, after the LD/T passes the M/U bin 80, but before it reaches or passes detector 110, then the path between connectors B-C-E1 is used. If the count is still higher so that the LD/R is not loaded until LD/T reaches or passes detector 110, the path B-C-E2 is used.

An examination is first made according to DB 198 to determine whether the LD/R is on wheel 18. This determination is made by machine counting the number of acceptable diodes 12 which have passed T.S. 70 subsequent to the identified last position 31 which will advance the last diode for taping (LD/T). To such number is added a number of acceptable diodes presumed to be then loaded in a known number of positions 31 occurring between loading bin 40 and T.S. 70. A sum is obtained representing a number of potentially acceptable diodes for replenishment. Such sum is then machine compared with the required replenishment number to determine equivalence for replenishing bin 80 according to DB 198. If equivalence is then reached, the normal path of routine is followed and the blocking mechanism 140 is actuated according to PB 221 to stop loading diodes onto wheel 18. It will be appreciated that this is an empirical procedure because the positions between location 32 and 33 will not always be filled with diodes and the diodes therein may not always be acceptable diodes 12. However, in a typical example there are only about 28 such positions between locations 32 and 33 so it is unusual when a position is vacant or that an unacceptable diode 13 is found therein.

In the example shown in FIGS. 1 and 4 there are typically about 71 positions 31 from loading location 32 to M/U location 36. Since the number of diodes 12 for replenishment rarely exceeds 70, it is normal to find that the decision according to DB 198 is affirmative and that the loading will be stopped in the normal routine. Thereafter, determination is made whether the LD/T has just passed the M/U bin 80 according to DB 223. If it has, the cam 126 is actuated according to PB 186, otherwise, S/R Diode Test and S/R Vac. Pos. Check are repetitively called according to PB 163 and 194, respectively, until the LD/T has passed the M/U bin 80 and cam 126 can be raised. Thereafter, testing at T.S. 70 according to PB 163 continues and checking for vacant positions at detector 110 according to PB 194 continues until a determination is made according to DB 225 that the LD/T has passed the detector 110.

If the needed number for replenishment is above normal, the loading of wheel 18 may have to continue so S/R Replenish M/U Bin is called in the alternate path according to PB 199 to test diodes and supervise the M/U bin count. Also, S/R Vac. Pos. Check is called according to PB 194 because diodes 12 are still being supplied for taping. Examination is also made according to DB 223 in this alternate loop to determine when the LD/T passes the M/U bin so cam 126 may be raised according to PB 186.

The paths of routine shown in FIG. 12 are similar to the paths just discussed except that the replenishment of bin 80 has started so an examination is no longer made to tell when the LD/T passes bin 80. Instead, an examination is now made to tell when the same diode passes the detector 110 so a vacant position check can be discontinued. Of course, the LD/R is still to be identified so loading continues.

An examination is made to determine whether the LD/R is on wheel 18 according to DB 198 and if it is, blocking mechanism 140 is extended to stop loading carrier wheel 18 according to PB 221. An examination is then made according to DB 225 to determine if the LD/T is at or beyond detector 110 at which time such detection can be discontinued. Until then the S/R Diode Testing and S/R Vac. Pos. Check continue to be called according to PB 163 and PB 194.

In the alternate loop, the LD/R is not yet on wheel 18 so S/R Replenish M/U Bin is called according to PB 199 and S/R Vac. Pos. Check is called according to PB 194 until the LD/T reaches or passes detector 110 according to DB 225 or until the LD/R is on the wheel according to DB 198. Assuming the LD/T reaches the detector first, the check for vacant positions is discontinued and S/R Replenish M/U Bin is continued according to PB 199 until an examination according to DB 198 shows the LD/R to be on the wheel 18. Then the blocking mechanism 140 is actuated and loading stops according to PB 221. Paths E1 and E2 converge in the chart and off-page connector "E" is provided to follow the routine in FIG. 13.

Referring to FIG. 1, it can be seen that the length of trailer tape which will be developed is proportional to the number of vacant wheel positions subsequent to the LD/T as long as wheel 18 continues to rotate and the taping operation is in place. It will be recalled that a count of such number of subsequent vacant positions was machine initiated after the LD/T was identified so that the location of the LD/T could be determined to actuate cam 126 and to discontinue the vacant position check. Such subsequent count is also used to develop a proper length of trailer tape.

Referring again to FIG. 13, the machine counted number of positions passing T.S. 70 after the position for carrying the LD/T has passed therefrom is obtained. According to DB 227 such number is machine compared with a predetermined number of such positions needed to develop a given length of trailer tape to determine equivalence. Until such equivalence is reached, the wheel 18 continues to rotate and S/R Diode Test continues to be called according to PB 163. However, by reference to FIG. 5, it can be seen that such testing only takes place until the LD/R has passed T.S. 70 since DB 152 thereafter provides for the test function to be by-passed.

When trailer tape has been completely developed the rotation of wheel 18 is stopped according to PB 228 and an output signal energizes a light according to PB 230 to indicate that the taping run is completed. An examination is made to determine acknowledgment of the output according to DB 232 and, if such is done, the light is extinguished according to PB 233. Note, however, that power to the operation may remain "on" unless taping is to be discontinued for some reason. There typically is no need to go through the pre-taping operation shown in FIG. 9 before the next run. The "run" button position and the presence of an empty reel is examined according to DB 184 and DB 185 and, if all is in order, a new run begins according to PB 190, as shown in FIG. 10. Off-page connectors "F" in FIG. 13 and in FIG. 10 are provided to follow the routine.

The routine set forth in FIGS. 5–13 is seen to be illustrative of a method by which computer technology is used in the practice of the invention. It is believed that more conventional methods of mechanical and/or electrical control can as well be used to machine control the various functions whereby operator attention is minimized. Also, it is believed desirable for other operations that articles be introduced onto a carrier such that virtually all positions are filled before the given operation takes place. The taping operation described herein is believed to be illustrative of such an operation where special problems obtain and are solved in the practice of the invention.

There have been illustrated herein certain practical embodiments of the invention and certain applictions thereof. Nevertheless, it is to be understood that various modifications and refinements may be made and used which differ from these disclosed embodiments without departing from the spirit and scope of the present invention.

What is claimed is:

1. Apparatus for introducing elongated magnetic articles into vacant positions on a carrier, comprising:
   a bin containing such articles, having a feed end in communication with the carrier and having spaced sidewalls with arm sections thereof extending substantially beyond the periphery of the carrier and along the sides thereof;
   means for advancing the carrier along a path in communication with the articles in the bin;
   means for establishing between and transverse to said sidewalls a first magnetic field of sufficient strength relative to the weight and material of the articles to orient and suspend such articles between the sidewalls; and
   means for establishing between and transverse to the sidewall arm sections of the bin a second magnetic field of sufficient strength relative to the weight and material of the articles and the conditions on the carrier to introduce such articles into vacant positions on the carrier.

2. Apparatus as in claim 1, wherein means are provided for stopping the articles from feeding from the bin, further comprising:
   mounting means, stationary with respect to the carrier and disposed at a location along its path where the carrier is advanced between spaced sidewalls of the bin;
   a blocking member, movably engaged with the mounting means, said member being disposed lengthwise of the carrier and normally positioned inside the periphery thereof to avoid contact with articles positioned transversely upon the peripheral surface of the carrier;
   means for moving the blocking member in a direction substantially normal to the periphery of the carrier to an active position outside the periphery of the carrier to block articles in the bin and thereby to stop feeding such articles therefrom.

3. Apparatus as in claim 1, wherein means are provided for stopping articles from feeding from the bin and for replenishing the bin with articles, further comprising:
   mounting means, stationary with respect to the carrier and disposed at a location along its path where the carrier is advanced between spaced sidewalls of the bin;
   a camming member having an end pivotally mounted to the mounting means, said member being disposed lengthwise of the carrier and normally positioned inside the periphery thereof to avoid contact with articles positioned transversely upon the peripheral surface of the carrier;
   means for pivotally moving a free end of the camming member to an active position outside the periphery of the carrier, as such carrier is advanced, such that articles stop feeding from the bin and any articles on the carrier surface are dislodged therefrom by the cam and are urged into the bin.

4. Apparatus as in claims 2 or 3, wherein the articles have a generally central body with a first and a second lead extending collinearly from said body and wherein the blocking member and the camming member further comprise:
   a recess extending in along each such member in a surface thereof which contacts the articles, there being first and second unrecessed sides along such surface, said recess being sufficiently wide in a direction transversely of the carrier to accommodate the body of an article therein when the first and second leads are disposed, respectively, on the unrecessed, first and second sides of each such member.

5. Apparatus as in claim 1, wherein the second magentic field is stronger than the first magnetic field, further comprising:
   means for locating the second magnetic field within the periphery of the carrier in a region such that the articles are introduced into vacant positions at a desired location along the path of the carrier.

6. Apparatus as in claim 5, wherein the second magnetic field is located in a bottom region of the sidewall arm sections such that the articles are introduced along the path of the carrier at a bottom portion of the feed bin.

7. Apparatus as in claim 5, wherein the bin includes a storage section having full depth sidewall magnets and a feed section having sidewall arm magnets extending substantially short of the bottom of the bin, said feed section being in communication with the carrier, further comprising:
   a non-magnetic region at the feed end of the bin under the arm magnets.

8. Apparatus as in claim 7, wherein the advancing means further comprises:
   means for advancing the carrier in a descendent path between and along the sidewall arm magnets and through the non-magnetic region of the bin.

9. Apparatus as in claim 8, wherein the bin is inclined toward the carrier, further comprising:
   a floor in the bin, extending toward the carrier, having a portion thereof turned partially upward at the feed end to substantially exclude and guide articles from the non-magnetic region of the bin, the floor terminating adjacent to the carrier such that an article cannot pass between the floor and an article positioned on the carrier.

10. A method of introducing elongated magnetic articles into vacant positions on a carrier such that various functions are machine controlled, comprising:
    machine loading the articles into continuously occurring vacant positions on an advancing carrier;
    machine sensing each position and each article as the carrier advances such position and such article beyond a testing location to determine:
    the number of positions, if any, which are vacant when passing such location and
    the number of unacceptable articles, if any, passing such location;
    machine ejecting unacceptable articles from the carrier;
    machine adding the number of vacant positions to the number of unacceptable articles to determine a number of articles to be made-up on the carrier; and
    machine making-up articles on the carrier.

11. The method of claim 10, wherein the machine sensing step includes determining the number of acceptable articles passing the testing location such that the number of articles supplied to a given operation is machine controlled, further comprising:
    machine adding the number of acceptable articles passing the testing location to the number of articles to be made-up to determine, from beyond the testing location, a cumulative number of articles supplied to the given operation at any instant as the carrier is advancing;

machine comparing the number of articles supplied to the given operation with a desired number of such articles to be supplied, to identify a last position at the testing location which will advance a last required article to the operation; and machine actuating a camming mechanism when such identified last position is advanced beyond the make-up bin to stop feeding articles from the bin and to divert articles found in positions subsequent to the identified last position into the make-up bin to replenish such bin for articles previously made-up therefrom.

12. The method of claim 11, wherein replenishing the make-up bin is also machine controlled, further comprising:

machine counting the number of acceptable articles passing the testing location subsequent to the identified last position having passed such testing location and machine adding thereto a number of acceptable articles presumed to be loaded in a known number of positions occurring between a preceding carrier loading bin and the testing location to obtain a sum of potentially acceptable articles for replenishment;

machine determining a number of articles for replenishing the make-up bin equivalent to the number of articles determined for make-up among the articles supplied to the given operation;

machine comparing the sum of such potentially acceptable articles for replenishment with the number of articles determined for replenishing from the make-up bin to determine a presumed equivalence for replenishing the bin for articles made-up therefrom; and machine stopping the loading of articles on the carrier from the loading bin when such replenishing equivalence is reached.

13. The method of claim 12, wherein the given operation is an article taping operation and wherein a development of trailer tape after taping the last article is also controlled, further comprising:

machine comparing a number of subsequently counted positions passing the testing location after the identified last position has passed therefrom with a predetermined number of such positions known to develop a given length of trailer tape at the taping operation after taping the last article, to determine equivalence for trailer tape purposes; and machine stopping the carrier when such equivalence is reached.

* * * * *